United States Patent
Pandey et al.

(10) Patent No.: US 11,940,739 B2
(45) Date of Patent: *Mar. 26, 2024

(54) METROLOGY APPARATUS

(71) Applicant: ASML Netherlands B.V., Veldhoven (NL)

(72) Inventors: Nitesh Pandey, Eindhoven (NL); Arie Jeffrey Den Boef, Waalre (NL); Duygu Akbulut, Eindhoven (NL); Marinus Johannes Maria Van Dam, Venlo (NL); Hans Butler, Best (NL); Hugo Augustinus Joseph Cramer, Eindhoven (NL); Engelbertus Antonius Fransiscus Van Der Pasch, Oirschot (NL); Ferry Zijp, Nuenen (NL); Jeroen Arnoldus Leonardus Johannes Raaymakers, Veldhoven (NL); Marinus Petrus Reijnders, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 71 days.

This patent is subject to a terminal disclaimer.

(21) Appl. No.: 17/562,446

(22) Filed: Dec. 27, 2021

(65) Prior Publication Data
US 2022/0121127 A1    Apr. 21, 2022

Related U.S. Application Data

(63) Continuation of application No. 16/431,833, filed on Jun. 5, 2019, now Pat. No. 11,262,661.

(30) Foreign Application Priority Data

| Jun. 13, 2018 | (EP) | 18177431 |
| Aug. 21, 2018 | (EP) | 18189926 |
| Nov. 22, 2018 | (EP) | 18207812 |

(51) Int. Cl.
| G03F 7/20 | (2006.01) |
| G01N 21/956 | (2006.01) |
| G03F 7/00 | (2006.01) |

(52) U.S. Cl.
CPC ....... G03F 7/70625 (2013.01); G01N 21/956 (2013.01); G03F 7/7015 (2013.01); G03F 7/70633 (2013.01)

(58) Field of Classification Search
CPC ...... G01N 21/956; G01N 21/47; G01N 21/33; G01N 21/9501; G01N 21/88;
(Continued)

(56) References Cited

U.S. PATENT DOCUMENTS

| 4,710,026 A | 12/1987 | Magome et al. |
| 6,465,783 B1* | 10/2002 | Nakasuji ............... H01J 37/28 250/311 |

(Continued)

FOREIGN PATENT DOCUMENTS

| EP | 1 628 164 A2 | 2/2006 |
| WO | WO 2011/012624 A1 | 2/2011 |

OTHER PUBLICATIONS

International Search Report and Written Opinion of the International Searching Authority directed to related International Patent Application No. PCT/EP2019/063028, dated Aug. 27, 2019; 13 pages.

(Continued)

*Primary Examiner* — Hoa Q Pham
(74) *Attorney, Agent, or Firm* — Sterne, Kessler, Goldstein & Fox P.L.L.C.

(57) ABSTRACT

A metrology tool for determining a parameter of interest of a structure fabricated on a substrate, the metrology tool (Continued)

comprising: an illumination optical system for illuminating the structure with illumination radiation under a non-zero angle of incidence; a detection optical system comprising a detection optical sensor and at least one lens for capturing a portion of illumination radiation scattered by the structure and transmitting the captured radiation towards the detection optical sensor, wherein the illumination optical system and the detection optical system do not share an optical element.

19 Claims, 9 Drawing Sheets

(58) Field of Classification Search
CPC .......... G01N 21/9505; G01N 2201/12; G01B 11/00; G06T 7/80; G06T 7/74; G03F 7/0141; G03F 7/7092; G03F 7/70625; G03F 7/7015; G03F 7/7085; G03F 7/7065
USPC .................................. 356/237.1–237.5, 338
See application file for complete search history.

(56) References Cited

U.S. PATENT DOCUMENTS

| | | | |
|---|---|---|---|
| 6,952,253 | B2 | 10/2005 | Lof et al. |
| 7,697,128 | B2 | 4/2010 | Snel et al. |
| 7,701,577 | B2 | 4/2010 | Straaijer et al. |
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 9,294,689 | B2 | 3/2016 | Thorsted |
| 10,338,484 | B2 | 7/2019 | Den Boef et al. |
| 11,262,661 | B2 * | 3/2022 | Pandey ............... G03F 7/70625 |
| 2002/0015148 | A1 | 2/2002 | Tomomatsu |
| 2003/0184739 | A1 | 10/2003 | Wilk et al. |
| 2004/0032581 | A1 * | 2/2004 | Nikoonahad ...... G01N 21/9501 356/237.2 |
| 2004/0174518 | A1 * | 9/2004 | Naiki ................. G01N 21/8806 356/237.2 |
| 2004/0207836 | A1 | 10/2004 | Chhibber et al. |
| 2005/0052642 | A1 | 3/2005 | Shibata et al. |
| 2006/0285112 | A1 | 12/2006 | Reich et al. |
| 2007/0177138 | A1 | 8/2007 | Esmaeili |
| 2008/0174771 | A1 | 7/2008 | Yan et al. |
| 2008/0225410 | A1 | 9/2008 | Ning et al. |
| 2009/0213351 | A1 * | 8/2009 | Kok .................... G03F 7/70358 355/77 |
| 2009/0299655 | A1 | 12/2009 | Biellak et al. |
| 2010/0328655 | A1 | 12/2010 | Den Boef |
| 2011/0026032 | A1 | 2/2011 | Den Boef et al. |
| 2011/0038065 | A1 | 2/2011 | Miyawaki et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0021602 | A1 | 1/2013 | Dribinski et al. |
| 2013/0162996 | A1 | 6/2013 | Straaijer et al. |
| 2013/0265572 | A1 | 10/2013 | Delgado |
| 2013/0308124 | A1 | 11/2013 | Ramachandran et al. |
| 2014/0126049 | A1 | 5/2014 | Yamamoto |
| 2016/0025648 | A1 | 1/2016 | Duffy et al. |
| 2016/0061750 | A1 | 3/2016 | Den Boef et al. |
| 2016/0161863 | A1 | 6/2016 | Den Boef et al. |
| 2017/0045823 | A1 | 2/2017 | Quintanilha |
| 2017/0205342 | A1 | 7/2017 | Krishnan et al. |
| 2017/0249753 | A1 | 8/2017 | Otani et al. |
| 2017/0261428 | A1 | 9/2017 | Coene et al. |
| 2019/0384184 | A1 | 12/2019 | Pandey et al. |

OTHER PUBLICATIONS

International Preliminary Report on Patentability directed to related International Patent Application No. PCT/EP2019/063028, dated Dec. 15, 2020; 7 pages.
Non-Final Office Action directed to U.S. Appl. No. 16/431,833, dated Mar. 17, 2020; 11 pages.
Non-Final Office Action directed to U.S. Appl. No. 16/431,833, dated Jan. 11, 2021; 17 pages.
Non-Final Office Action directed to U.S. Appl. No. 16/431,833, dated Aug. 17, 2021; 13 pages.
Final Office Action directed to U.S. Appl. No. 16/431,833, dated Aug. 17, 2020; 17 pages.
Final Office Action directed to U.S. Appl. No. 16/431,833, dated May 3, 2021; 13 pages.
Notice of Allowance directed to U.S. Appl. No. 16/431,833, dated Oct. 26, 2021; 10 pages.

* cited by examiner

METROLOGY APPARATUS

CROSS REFERENCE TO RELATED APPLICATIONS

This application is a continuation application of U.S. patent application Ser. No. 16/431,833, filed on Jun. 5, 2019, which claims priority to European Patent Application 18207812.1, filed on Nov. 22, 2018, European Patent Application 18189926.1, filed on Aug. 21, 2018, and European Patent Application 18177431.6, filed on Jun. 13, 2018, which are hereby incorporated herein in their entireties by reference.

FIELD

The invention relates to a metrology apparatus and associated methods for determining a parameter of a structure fabricated on a substrate. More specifically, the invention may relate to a metrology apparatus using a computational imaging methodology. In some examples, the invention may relate to determining a parameter relating to overlay.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer). The projected pattern may form part of a process to fabricate a structure onto the substrate.

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Tools to make such measurements are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

Scatterometers MT may be angular resolved scatterometers. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

Scatterometers MT may alternatively be spectroscopic scatterometers MT. In such spectroscopic scatterometers MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

Scatterometers MT may alternatively be ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Nos. 11/451,599, 11/708,678, 12/256,780, 12/486,449, 12/920,968, 12/922,587, 13/000, 229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations.

More examples are described in US patent application US2016-0161863 and not yet published U.S. patent application Ser. No. 15/181,126, incorporated herein by reference in its entirety.

There is a growing need of improving the capabilities of the scatterometer and/or the metrology tool.

SUMMARY

It is difficult to combine all the above requirements in a single optical system, however, a solution may be to simplify the optics and using easily manufacturable optics of which the characteristics may be well-known and using computational algorithms to improve images recorded by the simplified optical system. Exemplary methods and apparatus disclosed herein relate to an architecture of a scatterometer and/or metrology tool that has a simplified optical system that comprises a reduced number of optical elements.

According to an aspect of the invention, there is provided a metrology tool for determining a parameter of interest of a structure fabricated on a substrate, the metrology tool comprising: an illumination optical system for illuminating the structure with illumination radiation under a non-zero angle of incidence; a detection optical system comprising a detection optical sensor and at least one lens for capturing a portion of illumination radiation scattered by the structure and transmitting the captured radiation towards the detection optical sensor, wherein the illumination optical system and the detection optical system do not share an optical element.

Optionally, at least part of an optical axis of the illumination optical system is substantially parallel to an optical axis of the detection optical system.

Optionally, at least part of the illumination optical system is positioned radially outwards from a radial extent of the detection optical system.

Optionally, the illumination optical system comprises a plurality of discrete optical paths.

Optionally, at least two of the plurality of optical paths are diametrically opposed.

Optionally, the illumination optical system comprises at least one mirror for reflecting illumination radiation towards the structure.

Optionally, the metrology tool comprises at least one mirror in one or more of the plurality of optical paths.

Optionally, the at least one mirror is configured to direct the illumination radiation onto the structure through a volume between at least one lens of the detection optical system and the substrate.

Optionally, the at least one mirror is configured to direct radiation having a plurality of wavelengths in a range from 300 nm to 2 µm to substantially the same point on the substrate.

Optionally, the at least one mirror is one of an elliptical or a parabolic mirror.

Optionally, the at least one mirror has a reflectivity greater than 90% across a range of wavelengths of the illumination radiation.

Optionally, the detection optical system has a total transmissivity of greater than 90%.

Optionally, the detection optical system comprises 5 optical elements or fewer, for example, a single optical element, or two optical elements, or three optical element or four optical elements.

Optionally, the detection optical system comprises one or more of: a plano-convex lens; an aspheric lens; and a long working distance objective.

Optionally, the detection optical system comprises a plurality of lenses, and wherein one of the plurality of lenses positioned closest to the substrate has a working distance between the substrate and a surface of the lens of one of: greater than 300 μm; greater than 500 μm; and in a range from 300 μm to 10 mm.

Optionally, the lens has a numerical aperture of: greater than 0.4; greater than 0.7; greater than 0.9; or 0.95 or greater.

Optionally, the metrology tool further comprises a focus system comprising at least one focussing optical sensor configured to receive zeroth order radiation reflected from the structure and a computational imaging processor configured to determine a focus of the detection optical system based on.

Optionally, the focussing optical sensor comprises a quad optical sensor, arranged such that a proportion of the reflected zeroth order radiation that is sensed by each optical sensor in the quad optical sensor is indicative of a position of the structure.

Optionally, at least one of the plurality of discrete optical paths is configured to receive, at least in part, reflected zeroth order radiation originating from at least one other of the optical paths, and wherein the at least one of the plurality of discrete optical paths comprises a reflective optical element configured to direct the received zeroth order radiation towards the at least one focussing optical sensor.

Optionally, the at least one focussing optical sensor is positioned radially outwards from a radial extent of the detection optical system.

Optionally, the metrology tool further comprises a polarization element arranged around an outer of the detection optical system and configured to interact with radiation propagating through the illumination optical system for polarization thereof.

Optionally, the polarization element is configurable to apply one of s or p polarization at a plurality of magnitudes.

Optionally, the polarization element is rotatable to apply one of s or p polarization at one of a plurality of magnitudes.

Optionally, the metrology tool is configured to apply one of s or p polarization at one of a plurality of magnitudes to one or more of the plurality of optical paths.

Optionally, the detection optical sensor is configured to acquire a first image based on reflected and/or diffracted radiation having one order, and further configured to acquire a second image based on reflected and/or diffracted radiation having a further order.

Optionally, the metrology tool comprises a shutter system positioned in at least one of the plurality of optical paths configurable between an open position in which illumination radiation is allowed to pass and a closed position in which illumination radiation is blocked.

Optionally, the shutter system comprises one or more acousto-optic-tunable filters.

Optionally, the metrology tool further comprises a reference optical sensor, wherein the at least one of the plurality of optical paths comprises a beam splitter configured to direct a proportion of the illumination radiation to the reference optical sensor when the shutter system is in the open position.

Optionally, the proportion of the illumination radiation is less than 5%.

Optionally, the metrology tool further comprises an image normalisation unit configured to normalise the first and second images based on a reference image acquired by the reference optical sensor.

Optionally, the metrology tool further comprises an acquisition controller configured to control the reference optical sensor, the detection optical sensor and the shutter system for capturing the first and second images.

Optionally, a first shutter system is positioned in a first optical path of the illumination optical system and a second shutter system is positioned in a second optical path of the illumination optical system, and wherein the first shutter system is operable for acquiring the first image and the second shutter system is operable for acquiring the second image.

Optionally, the acquisition controller is configured to place the reference optical sensor in an acquisition phase and to open and close the first and second shutter systems sequentially while the reference optical sensor is in the acquisition phase.

Optionally, the acquisition controller is further configured to place the detection optical sensor in a first acquisition phase such that the first shutter system is opened and closed while the detection optical sensor is in the first acquisition phase for acquiring the first image, and wherein the acquisition controller is further configured to place the detection optical sensor in a second acquisition phase such that the second shutter system is opened and closed while the detection optical sensor is in the second acquisition phase for acquiring the second image Optionally, the illumination optical system and the detection optical system has a footprint less than the area of a field of the substrate. The field size may have a dimension of 300 mm.

Optionally, the combination of the illumination optical system and the detection optical system has at least one of an x-dimension and a y-dimension less than 26 mm.

Optionally, the metrology tool may comprise a plurality of illumination optical system and detection optical system combinations in an array. Each of the plurality of illumination optical system and detection optical system combinations may comprise an array element. Each array element having a sensing axis.

Optionally, each array element is aligned with a different field of the substrate.

Optionally, the array elements are arranged in a two dimensional array.

Optionally, each array element has an array element footprint area on the substrate and the array comprises a tessellation of footprint areas.

Optionally, the footprint areas within the array are the same and one of triangular, square, rectangular or hexagonal in shape.

Optionally, the footprint areas are arranged in a honeycomb.

Optionally, the two dimensional comprises m rows and n columns, wherein m and n are both greater than 2.

Optionally, the array is adjustable such that the separation between adjacent array elements can be altered in at least one of the x direction or y direction.

Optionally, the elements of the array sensors are tiltable with respect to the plane of the substrate, such that the sensing axis of each array element is adjustable so as to be perpendicular with a substrate.

Optionally, each array element comprises a tilt sensor.

Optionally, the tilt sensor is located within the detection optical system.

Optionally, the tilt sensor is an optical sensor.

Optionally, the sensing element is located within the detection optical sensor.

Optionally, each array element is rotatable about the sensing axis.

Optionally, the element is configured to be rotatable about the sensing axis from a first position to a second position, wherein the first and second positions are in anti-parallel.

Optionally, each array element comprises one or more actuators configured to move the array elements.

Optionally, the actuators comprise piezo motors.

Optionally, the metrology tool may further comprise: a controller, wherein the controller is configured to position the array elements at a predetermined pitch, wherein the predetermined pitch corresponds to the pitch of metrology targets on a substrate.

Optionally, the spacing of the array elements corresponds to a die pitch of a substrate.

Optionally, the pitch of the array elements in the x or y direction is one or more of 16.5 mm, 26 mm, 33 mm.

Optionally, the metrology tool may comprise: a coherent radiation source emitting illumination radiation that is received by a plurality of optical paths of the illumination optical system.

Optionally, the coherent radiation source comprises a laser emitting white light.

Disclosed herein is a metrology tool for determining a parameter of interest of a structure fabricated on a substrate, the metrology tool comprising: an illumination optical system for illuminating the structure with illumination radiation; an array of detection optical systems comprising a detection optical sensor and at least one lens for capturing a portion of illumination radiation scattered by the structure and transmitting the captured radiation towards the detection optical sensor, wherein each element of the array of detection optical systems is adjustable such that the separation between adjacent elements of the array can be altered in at least one of the x direction or y direction.

Also disclosed herein is a metrology tool for determining a parameter of interest of a structure fabricated on a substrate, the metrology tool comprising: an illumination optical system for illuminating the structure with illumination radiation; an array of detection optical systems comprising a detection optical sensor and at least one lens for capturing a portion of illumination radiation scattered by the structure and transmitting the captured radiation towards the detection optical sensor, wherein the array is a two dimensional array with array elements arranged in a two dimensional array having m rows and n columns.

BRIEF DESCRIPTION OF DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
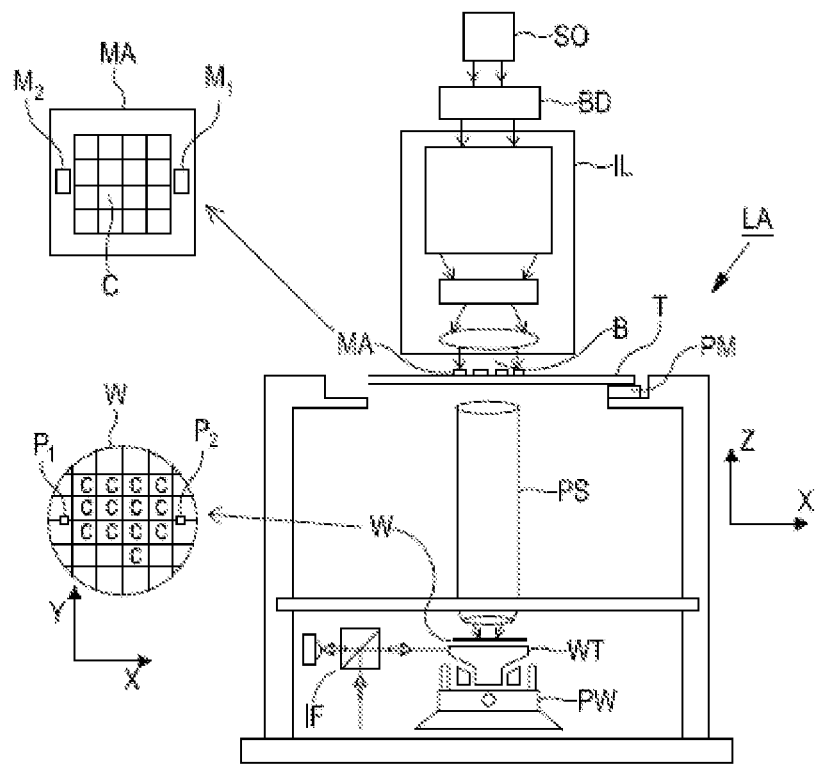
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
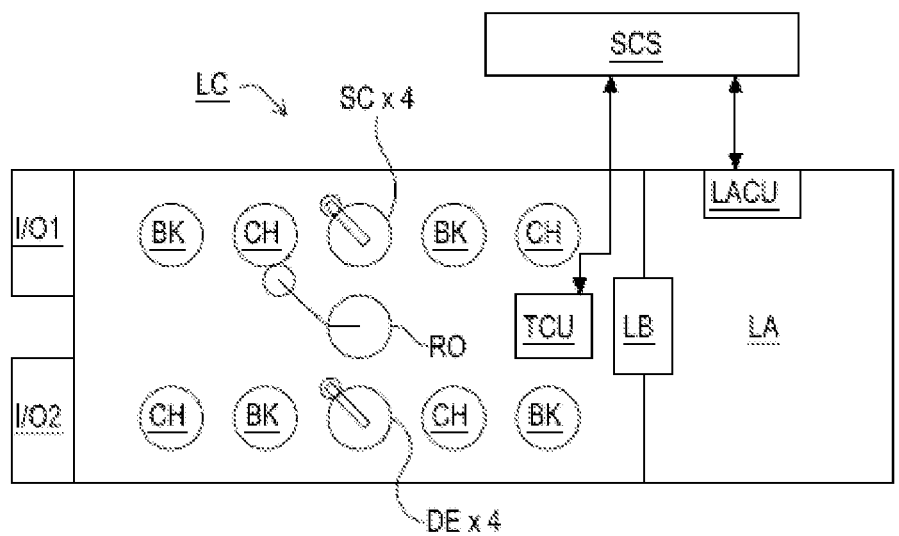
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology tool, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
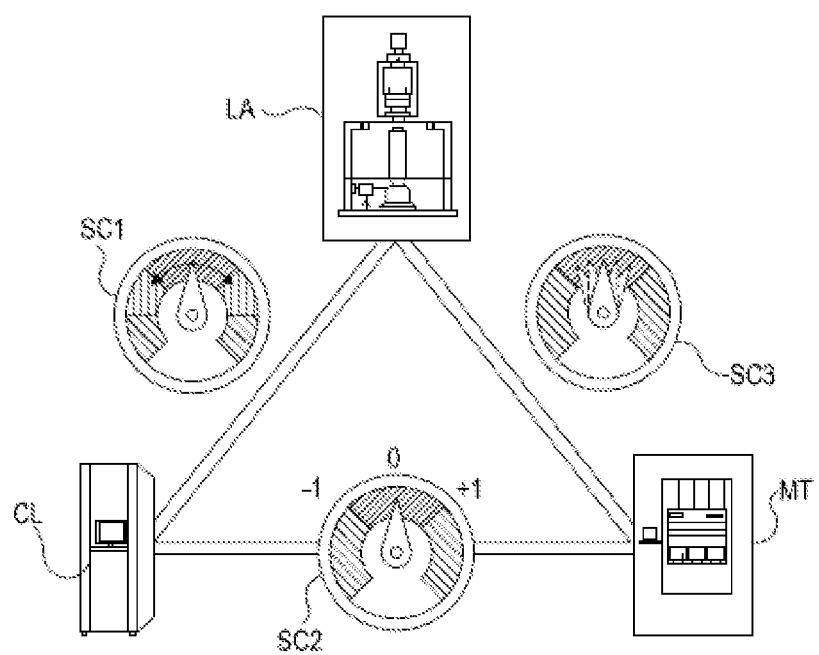
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

Figure 4:
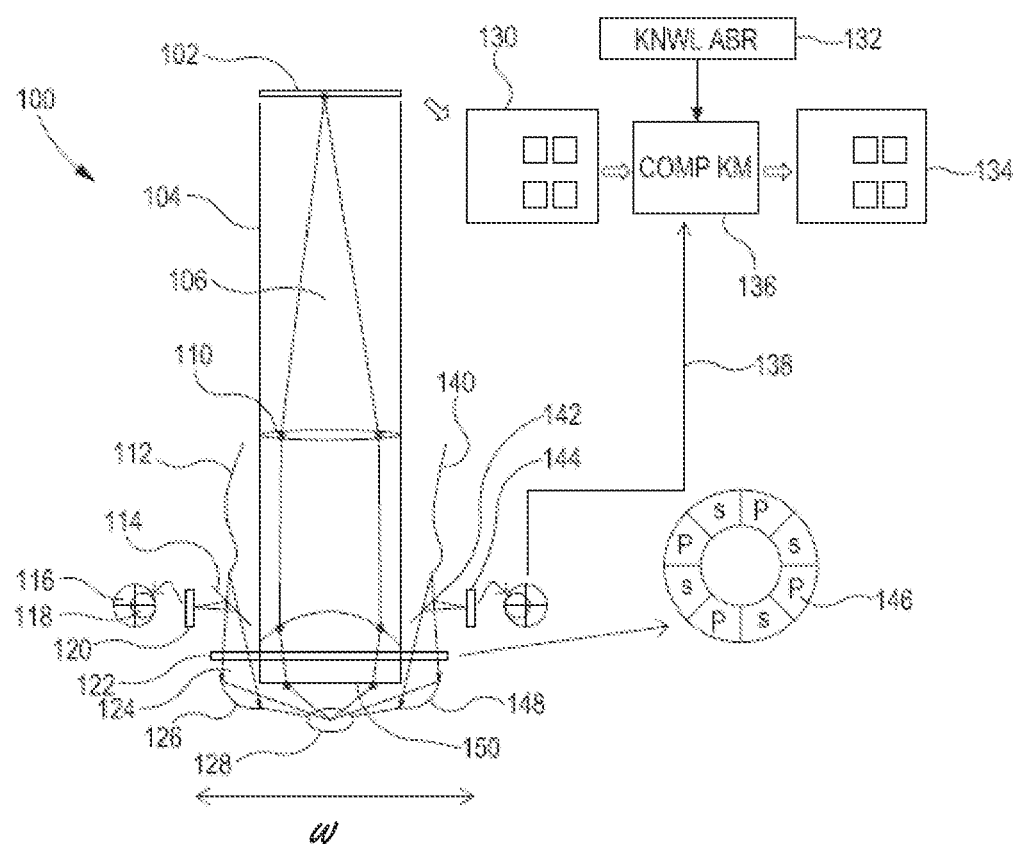
FIG. 4 shows a schematic representation of an exemplary metrology tool.

FIG. 4 shows an exemplary metrology tool 100. In metrology tool 100 there is a detection optical system that comprises two lenses 110, 150. In another embodiment only lens 150 is present in the detection optical system. In another embodiment, more lenses may be present in the detection optical system. In an embodiment the lenses 110, 150 are capable of transmitting and refracting radiation in a wide wavelength range, e.g. from 200 nm to 2000 nm, from 200 nm to 1000 nm or from 400 nm to 800 nm. The lenses 110, 150 may have a relatively large aberration and the aberration of the lenses 110, 150 may be known and is e.g. stored as a known aberration, KNWL ABR, 132.

Lens 150 captures a portion of radiation that is scattered by a structure 128 fabricated on, for example, a semiconductor substrate and/or a wafer. A working distance of the lens 150 (e.g. the distance between a surface of the lens 150 and the structure 128) may be greater than 300 μm, greater than 500 μm or in a range from 300 μm to 1 mm. The structure 128 may be a product structure or may be a specifically designed metrology structure, a so-termed (metrology) target, to measure certain characteristics of the process that is being applied to the semiconductor substrate and/or wafer. Captured radiation 106 may subsequently be imaged by lens 110 on a detection optical sensor 102, which may be a sensor with a pixel array that registers per pixel an amount of impinging radiation.

The sensor 102 may be a single sensor and may be capable of detecting radiation in a wavelength range from 200 nm to 2000 nm, and, in another embodiment, the sensor 102 is capable of detecting a smaller wavelength range, for example, from 200 nm to 1000 nm or from 400 nm to 800 nm. In another embodiment, the captured beam of radiation 106 is split into two separate beams and both of the separate beams are imaged on a separate sensor that each are sensitive to another wavelength range. The lenses 110, 150, and optionally also the sensor 102, may be provided in a tube 104. The lens 150 may have a relatively small NA, for example, smaller than 0.4, and in other embodiment the NA of lens 150 is larger, for example greater than 0.4, greater than 0.7, greater than 0.9 or 0.95 or greater. Lens 150 can be of any type of lens and may have aspheric surfaces designed for minimizing aberrations. The lens 150 may be one of a plano-convex lens; an aspheric lens; and a long working distance objective.

An illumination optical system for illuminating the structure 128 is separated from the detection optical system and shares as few as possible optical elements with the detection optical system. In one specific example, the illumination optical system and the detection optical system do not share an optical element. In exemplary arrangements, the illumination optical system may comprise two, four or more discrete optical paths and at least two of the discrete optical paths may be diametrically opposed. As used herein, an "optical element" encompasses elements that reflect or refract radiation, such as, for example mirrors and lenses.

Using the arrangement disclosed in FIG. 4, illumination radiation may be provided by one or both of the fibers 112, 140. The fibers 112, 140 may be single mode fibers and this may optionally result in single mode illumination of the structure on the substrate. The radiation 124 that is output from the fibers 112, 140 falls in the presented embodiment on mirror 126 or mirror 148, respectively, which subsequently reflects the radiation towards the structure 128. In the arrangement of FIG. 4, the illumination radiation is directed onto the structure 128 through a volume between the substrate and the lens 150 of the detection optical path. The mirrors 126, 148 may be elliptically shaped mirrors. The elliptically shaped mirrors may image the tips of the fibers 112, 140 on the structure 128. In another embodiment, the mirrors 126, 148 are parabolic mirrors. The mirrors 126, 148 are configured to direct radiation having a plurality of wavelengths in a range from 300 nm to 2 μm, 300 nm to 1 μm or 400 nm to 800 nm to substantially the same point on the substrate to form an illumination spot. The reflectivity of the mirrors 126, 148 may in some embodiments be substantially uniform for any of the above wavelength ranges.

Assuming that only fiber 112 provides illumination radiation, then the structure 128 reflects a portion of the illumination radiation towards mirror 148 and a portion of the radiation that is scattered by the structure 128 is captured by lens 150. In an embodiment radiation in one or more diffraction orders is captured by the lens 150.

It is also possible to use only fiber 140 to provide illumination radiation and then structure 128 reflects a portion of the illumination radiation towards mirror 126 and scattered light, for example of one or more diffraction orders opposite the diffraction orders of radiation from mirror 124 and diffracted by the structure 128, is captured by lens 150.

The illumination optical system may also comprise two beam splitters 114, 142 in between the tip of the fibers 112, 140 and mirrors 126, 148. Light that is reflected by the structure 128 and that falls on the mirrors 126, 148 is at least partially reflected towards a focus system comprising focussing optical sensors 120, 144 which have multiple areas that detect per area how much radiation impinges on the respective areas. For example, the focussing optical sensors 120, 144 have four quadrants wherein e.g. each quadrant comprises a photodiode capable of detecting the intensity of light that impinges on the quadrant. The position of the focussing optical sensors 120, 144 may be chosen such that the reflected illumination radiation forms a spot on the focussing optical sensor 120, 144. The four quadrants are for example shown at 116 together with such a spot 118.

The data recorded by the focussing optical sensors 120, 144 can be used in the focus system. If the structure 128 moves in the z-direction (up and down in FIG. 4) then the position of the spot moves over the focussing optical sensor 120 or focussing optical sensor 144 and at a certain position the structure 128 is at an optimum focus of the illumination radiation. By using the differently recorded intensities in the four quadrants, it can be determined at which position the spot 118 is on the focussing optical sensor 120 (or focussing optical sensor 144). A calibration mechanism can be used to determine the position at which the spot must be at the optimum focus position of the structure 128.

It is to be noted that, in certain embodiments of the metrology system 100, it is not necessary that the structure 128 is always exactly in optimum focus. Also if radiation is scattered at an out of focus position and if this scattered radiation is detected by sensor 102, then a processing unit, such as a computational imaging processor, COMPU IM, 136, algorithm may be capable of creating an in-focus image. For example, this may be enabled if information is available that comprises values that relate to how much is the structure 128 out of focus. For example, the data detected by the focussing optical sensors 120, 144 can be used in such a computational imaging, COMPU IM, 136, algorithm. Scattered radiation may be captured by the sensor 102 in two images each having different focus levels in order to retrieve phase information.

The design of the detection optical system and the illumination optical system is such that the combination of both is relatively compact. The illumination optical system, with its different sub-systems, are arranged directly around lens 150 and do not require much space or large optical elements. For example, a cross-sectional diameter (i.e., width "w") of the combination of the detection optical system and the illumination optical system may be smaller than 50 mm, or even smaller than 30 mm. This design allows the use of several instances of metrology tool 100 close to each other such that different structures, such as structure 128, can be inspected or measured simultaneously.

At least part of the illumination optical system and the detection optical system are parallel to each other. That is, the illumination optical beam and the detection optical beam are parallel to each other during at least part of the respective paths. The at least part of the respective paths may also be transverse and optionally at right angles to the substrate comprising the structure 128. More specifically and as shown in FIG. 4, at least part of the illumination optical system is radially outwards from the radial extent of the detection optical system, in this case defined by the tube 104.

The illumination optical system and the detection optical system together may have a footprint less than the area of a field of the substrate. In some examples, the combination of the illumination optical system and the detection optical system has at least one of an x-dimension and a y-dimension less than 26 mm. In this context, the x-dimension and y-dimension are those that are transverse to the z-dimension (described above and vertical in FIG. 4).

Exemplary metrology tools may comprise a plurality of illumination optical system and detection optical system combinations according to any disclosed herein. Each of the plurality of illumination optical system and detection optical system combinations may be configured such that they are aligned with a different field of the substrate.

The fibers 112, 140 may receive radiation from, for example, a laser. The laser may be capable of generating radiation in a relatively wide wavelength range, for example, from 200 nm to 2000 nm. The laser may be a tunable laser which generates a single wavelength and is tunable towards such a single wavelength in a relatively wide wavelength range. The laser may also be capable of generating radiation along the whole above mentioned wavelength range and filters may be used to select only a portion or only a single wavelength from this relatively wide wavelength range.

Exemplary metrology tools 100 may have a polarization element, which in this case is a polarizing ring 122 of which a top view 146 is presented in FIG. 4. The ring may be arranged to be rotatable around the tube 104 and lens 150 and may be arranged at such a position that illumination radiation that travels from the tip of one of the fibers 112, 140 towards its respective mirror 126, 148 via a portion of the polarizing ring 122. The polarizing ring 122 may have sections that polarize the radiation that travels through it into P or S polarized radiation. The polarizing ring 122 may have 8 sections that may be equally arranged along its circumference. Different types of polarizing areas alternate in each section. This allows the illumination of the structure 128 with illumination that has a certain polarization.

In some exemplary arrangements, the polarization element may have the same polarization for X (or Y) gratings; independent polarization between X and Y gratings; and/or support any polarization mode. Providing this with one disk may utilize either a disk with 36 polarization holes or a mechanism for continuous movement of the disk between X and Y gratings.

An alternative embodiment may comprise two disks which can rotate independently from each other. One addresses the X (and has an open slot for Y) and vice-versa for the other disk.

At the right top of FIG. 4, a possible workflow of the metrology tool is presented. For example, sensor 102 may provide a dark-field image 130 which is subject to aberrations of the lenses 150, 110 and which may provide an image at a non-ideal focus position of structure 128. This image 130 is input to a computational imaging processor, COMP IM, 136 running a computational imaging algorithm. The computational imaging processor, COMP IM, 136, may also receive multiple images 130, for example, recorded at different non-ideal focus positions. Together with the recorded images 130, the computational imaging processor, COMP IM, 136, may receive focus related information from one or more optical sensors 120, 144, and the computational imaging processor, COMP IM, 136, may receive knowledge about the aberrations of the lenses, KNWL ABR, 132. This information may be used by the computational imaging processor, COMP IM, 136, to obtain a better dark field image 134 and/or to obtain a complex field of radiation scattered by the structure 128.

Although in the above figure only two fibers 112, 140, two beam splitters 114, 142, two mirrors 126, 148 and two focussing optical sensors 120, 144 are presented, more of these elements may be provided around the tube 104. For example, in a top view of metrology tool 100, there may be four illumination radiation sub-systems arranged around tube 104 and lens 150. One or more of the four illumination radiation sub-systems may comprise at least one of a fiber, a beam splitter, a mirror and/or an optical sensor. Seen in the top view, these illumination radiation sub-systems may be provided at 0, 90, 180 and 270 degrees around the tube 104. Such a configuration allows the measurement of structure 128 from two orthogonal directions (e.g. x and y) and allows the detection of diffraction orders and opposite diffraction orders per one of the orthogonal directions without rotating structure 128 with respect to lens 150.

In exemplary arrangement of FIG. 4, the radiation that is reflected by the structure, in other words, the zeroth diffraction order, is not lost and is at least partially propagated toward the focussing optical sensors 120, 144. In an embodiment, these sensors can also be used to detect the intensity of the zeroth diffraction order and thereby this information can also be used to determine certain parameters of the structure 128. This allows a zeroth order spectral measurement.

If the intensity of the zeroth diffraction order is measured, and by using the above discussed polarizing ring 122 in a specific manner or by using a modified design of the polarizing ring, one can enable zeroth order cross-polarized measurements. E.g. the polarizing ring 122 can be made to have crossed polarizers at the diametrically opposite parts.

Figure 5B:
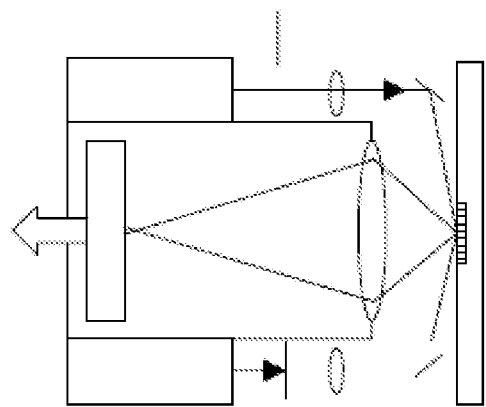
FIGS. 5a and 5b show a schematic representation of an exemplary metrology tool at different stages of operation
Figure 5A:
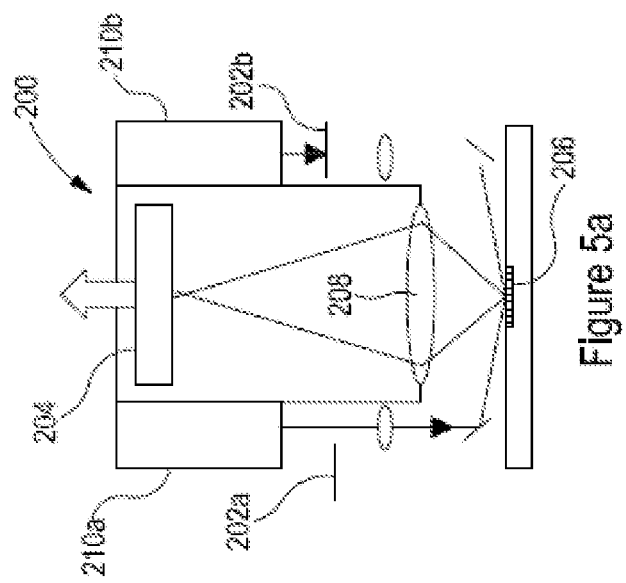

FIGS. 5a and 5b show simplified schematic representations of a metrology tool 200. One or more of the features of the metrology tool 100 described with respect to FIG. 4 may also be present in the metrology tool 200 as appropriate and these are not described again here in detail.

The metrology tool 200 comprises a shutter in at least one of the optical paths of the illumination optical system. In the example of FIGS. 5a and 5b, there are two optical paths and each optical path comprises a shutter 202a, 202b. In known exemplary arrangements, mechanical shutters are used. Such shutters typically have a switching speed (i.e. the time required to open or close the shutter) in the order of milliseconds.

The metrology tool 200 also comprises an optical sensor 204. The optical sensor 204 is positioned in the detection optical system and may therefore be termed a detection optical sensor. In some arrangements, the metrology tool

200 may also comprise features similar to or the same as the focussing optical sensors 120, 144. In exemplary arrangements, the optical sensor 204 may be a high-speed CMOS camera with at least 1000 frames per second.

As shown in FIGS. 5a and 5b, the metrology tool 200 may operate by sequential opening and closing of the shutters 202a, 202b to direct illumination radiation from alternate directions onto the structure 206, which diffracts it through the lens 208 and onto the optical sensor 204. This allows sequential measurement images to be captured, a measurement image being one formed on the detection optical sensor 204. FIG. 5a represents the configuration capturing the first measurement image and FIG. 5b represents the configuration capturing the second measurement image some time later. In exemplary arrangements, the illuminating radiation through a first shutter 202a provides the first measurement image comprising $+1^{st}$ order diffracted radiation, and the illuminating radiation through a second shutter 202b provides the second measurement image comprising $-1^{st}$ order diffracted radiation. The sequential images may be used by a processing unit, such as the computational imaging processor, COMP IM, 136 discussed above to determine a parameter of the structure 206.

In an ideal scenario, to use the sequential images to determine a parameter of interest of the structure 206, such as overlay, the integrated radiation intensity of each of the sequential measurement images would be the same. In practical implementations, the integrated radiation intensity of the sequential measurement images should be within 0.01% of each other. However, operation of the shutters 202a, 202b and acquisition of the sequential measurement images by the optical sensor 204 introduce errors in the shape of jitter. Specifically, acquisition time jitter is a random variation in the start and end of an acquisition time for each of the sequential measurement images, which affects the integrated radiation intensity of each measurement image. The acquisition time jitter manifests as a random variation in the number of collected photons in each pixel of an image since this scales linearly with acquisition time. In the end this results in a random error in the measured intensity difference between the $-1^{st}$ and $+1^{st}$ orders which results in noise in measurement of the parameter of the structure 206, such as overlay. Other error sources also may affect the integrated radiation intensity of each measurement image, such as the different brightness of each radiation source 210a, 210b.

Figure 6:
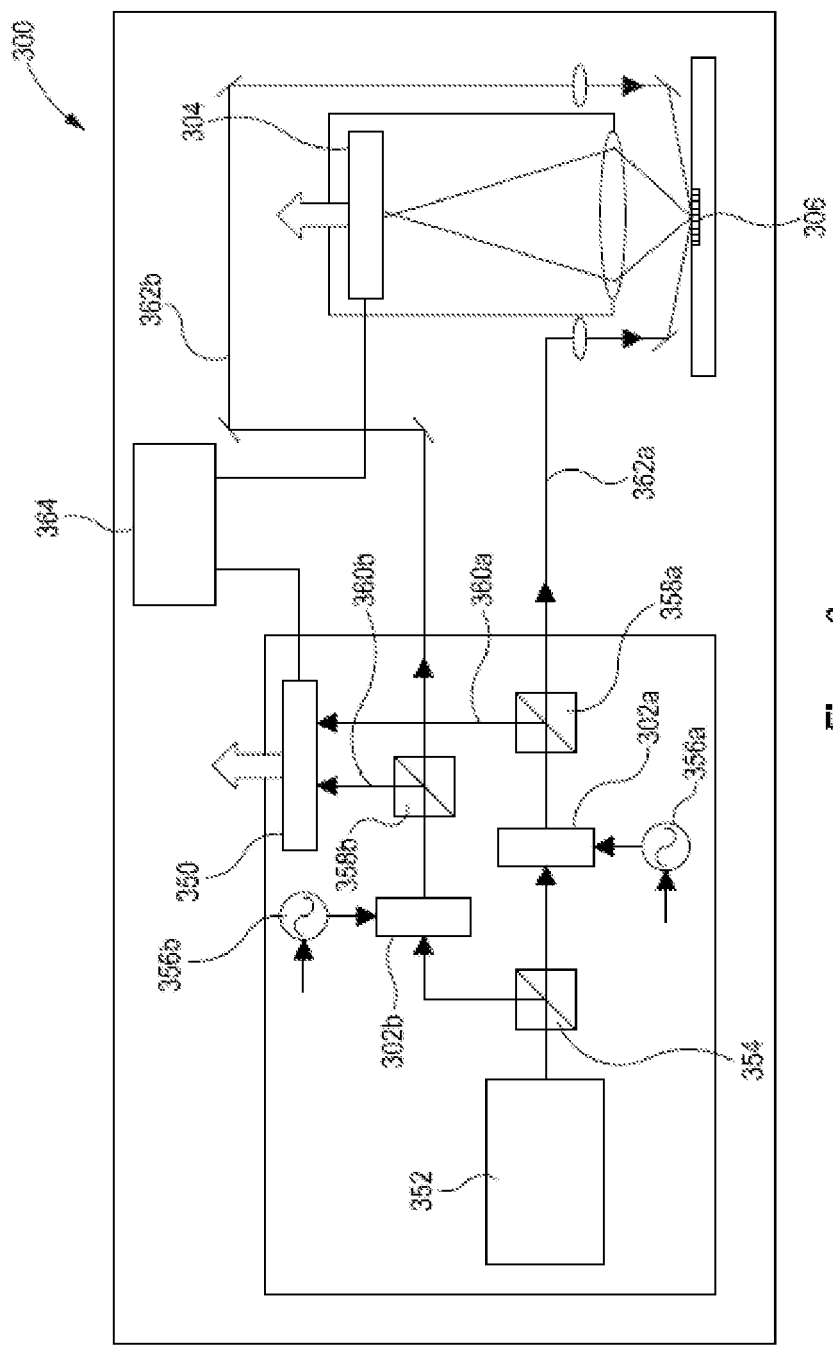
FIG. 6 shows a schematic representation of an exemplary metrology tool.

FIG. 6 shows a further exemplary metrology tool 300. The metrology tool 300 may comprise one or more of the features of FIGS. 5a and 5b, as appropriate, and those features are not discussed again here.

In addition, metrology tool 300 comprises a reference optical sensor 350 that is configured to capture a reference image having an acquisition time equal to that of the first and second sequential images discussed above in respect of FIGS. 5a and 5b. That is, the reference image is subject to the same acquisition time jitter as each of the first and second images. The reference image may be used to normalise the first and second measurement images and thereby mitigate or remove errors associated with acquisition time jitter and/or intensity of radiation source.

The metrology tool 300 comprises a single radiation source 352, which may be a supercontinuum source. The radiation source 352 is configured to emit radiation in a source beam towards a source beam splitter 354. The source beam splitter 354 is configured to split the source beam into two beams and direct a first beam towards a first shutter 302a and a second beam towards a second shutter 302b. In a specific arrangement, the first beam and the second beam have substantially equal radiation intensities.

In the exemplary arrangement of FIG. 6, the shutters 302a, 302b comprise acousto-optic-tunable filters (AOTFs) that are operated by an acoustic signal emitted by first and second acoustic signal generators 356a, 356b. Using AOTFs as shutters has the advantage that the shutters 302a, 302b are able to open and close more quickly. If the shutters 302a, 302b are open then the first and second beams respectively are propagated towards first and second reference beam splitters 358a, 358b. The reference beam splitters 358a, 358b are configured to split each of the first and second beams respectively into a first reference beam 360a, a first measurement beam 362a, a second reference beam 360b and a second measurement beam 362b. In exemplary arrangements, the first and/or second reference beams 360a, 360b have a radiation intensity that is less than 20%, less than 10%, less than 5% or may specifically be 5% or 1% of the first or second beam respectively.

An acquisition controller 364, which may for part of the processing unit, COMP IM, 136, or may be a separate processing unit is configured to control the reference optical sensor 350 and the detection optical sensor 304 to capture the reference image and the measurement image. The acquisition controller may also control the shutters 302a, 302b via the acoustic signal generators 356a, 356b to ensure that acquisition of the images is within an open time of each shutter, accounting for shutter jitter. Operation of the acquisition controller 364 is discussed in detail below with reference to FIGS. 7 and 8.

In the particular example of FIG. 6, the measurement images are acquired at a framerate of 1 kHz while the reference images are acquired at half that framerate (i.e. 500 Hz).

Figure 7:
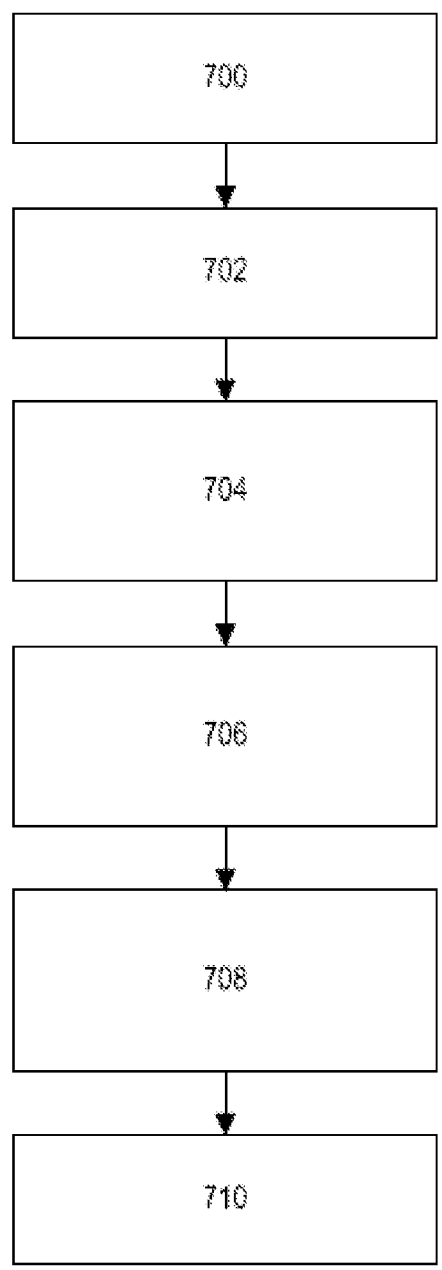
FIG. 7 shows a flow diagram for a method of operating a metrology tool.
Figure 8:
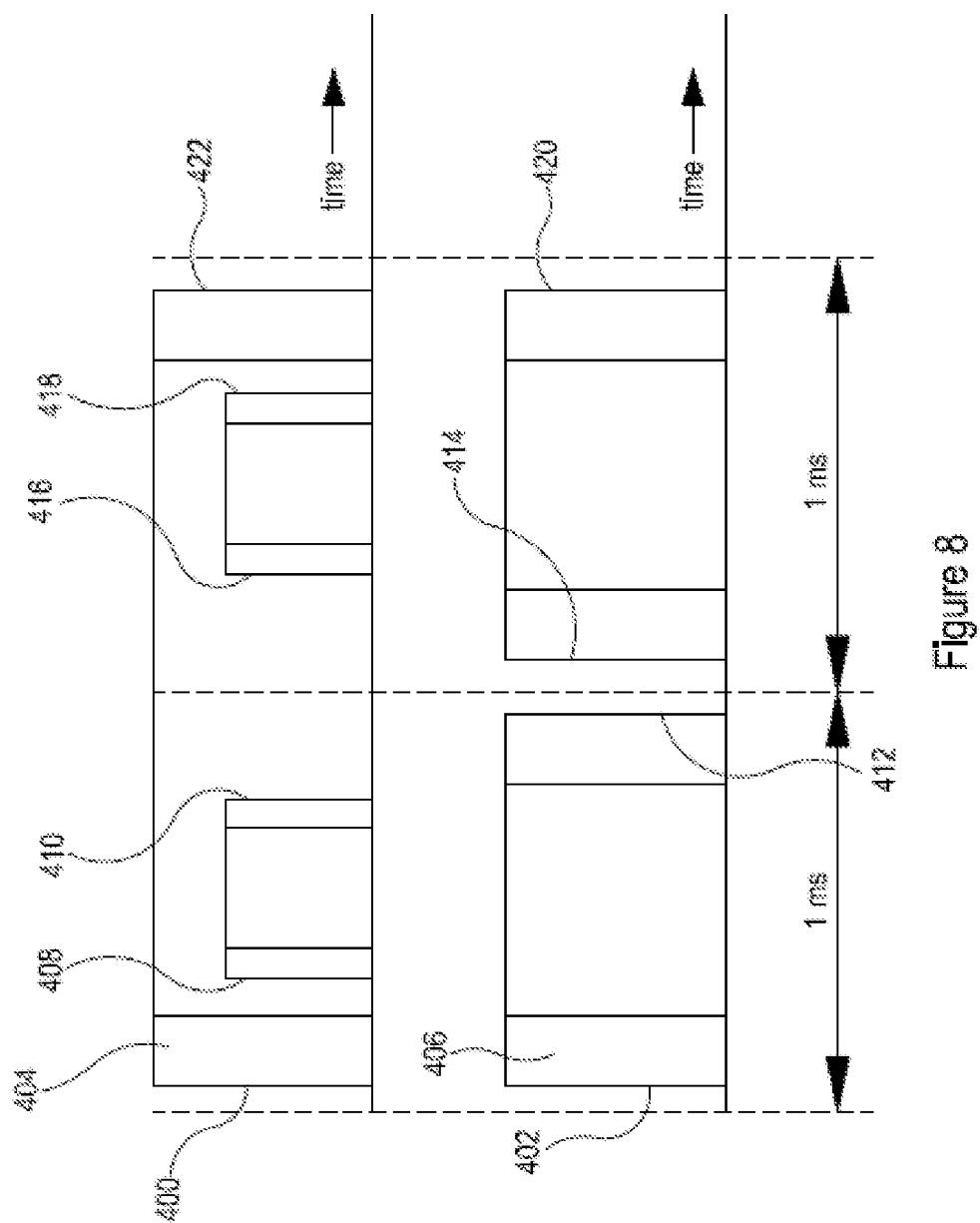
FIG. 8 shows a timing diagram corresponding to a method of operating a metrology tool.

Referring to FIGS. 7 and 8, a method of operating a metrology tool such as those disclosed herein is described.

The radiation source 352 generates 700 radiation having a range of wavelengths such as those described herein. The source beam splitter 354 splits 702 the source beam into two beams that, in one exemplary arrangement comprise equal proportions of the source beam. A first beam is received by a first shutter 302a and a second beam is received by a second shutter 302b. The first and second shutters 302a, 302b are configured to block or allow the first and second beams to pass under the control of first and second acoustic signal generators 356a, 356b.

The acquisition controller 364 controls 704 the reference optical sensor 350 to begin the acquisition time 400 of the reference images, and controls the detection optical sensor 304 to begin the acquisition time 402 of the first measurement image. At this stage, the shutters 302a, 302b are closed. After the acquisition times of the reference and first measurement images has begun, accounting for any jitter 404, 406, the acoustic signal generators 356a, 356b are controlled to open sequentially the first and second shutters 302a, 302b.

In exemplary arrangements of FIG. 6, a wavelength measuring unit may be added, which controls the output of the AOTFs 302a, 302b. An alternative embodiment may comprise one AOTF for both the $-1^{st}$ order and $+1^{st}$ order optical paths. In that case the wavelength delta between these two paths would be negligible and it would save one AOTF, in which case the AOTF may be positioned before the beamsplitter 354.

Further, an AOTF typically has polarized light as its output and, accordingly, exemplary arrangements may comprise a depolarizer after the AOTF.

Given the needed measurement accuracy between $-1^{st}$ order and $+1^{st}$ order images, exemplary arrangements may also comprise a feature for preventing light coming from one side going into the other side via the target and create a signal on the image sensor. One option may be to deliberately put the two optical paths not in line with each other. Alternatively, one could use two images.

As shown in FIGS. 7 and 8, the first shutter 302a is opened 706, 408 while the second shutter 302b remains closed. This allows the first beam to propagate to the reference beam splitter 358a, which directs a portion of the first beam to the reference optical sensor 350 and allows the remainder of the first beam to be directed to the structure 306 and on to the detection optical sensor 304 for measurement of a parameter of the structure as disclosed above. Sometime later, the first shutter 302a is closed 410. The first reference and measurement images are thereby captured. After capturing the first reference and measurement images, the acquisition controller 364 may end 412 the acquisition time of the first measurement image.

Because the acquisition of the first reference and measurement images is controlled by the first shutter 302a, the acquisition time of each is the same. Therefore, the integrated radiation intensity of the first reference image is proportional to that of the first measurement image and so can be used to normalise the first measurement image and remove the effects of jitter. The +1 order image and −1 order image are referred as $I_{+1}$ and $I_{-1}$. The reference images are referred to as $I_{\_ref\_+1}$ and $I_{\_ref\_-1}$. A region selection of the reference images is made from where to calculate the mean reference intensity. The selection may be of the full frame or a specific set of pixels. This region is called ROI. The mean reference values are calculated as the mean of the pixel values of the selected pixels and is referred as $I_{\mu\_ref\_+1}$ and $I_{\mu\_ref\_-1}$. The normalized intensities used for the overlay calculations are calculated as $I_{+1\_norm} = I_{+1}/I_{\mu\_ref\_+1}$ and $I_{-1\_norm} = I_{-1}/I_{\mu\_ref\_-1}$. Where the / sign refers to a division of the all the pixel values of the +1 and −1 order image with the mean reference value The process is repeated for the second shutter 302b, in that the acquisition time of the second measurement image is begun 414, the first shutter 302a is closed, the second shutter 302b is opened 708, 416 and subsequently closed 418 to capture the second reference and measurement images. The acquisition controller 364 then ends the acquisition times of the second measurement image 420 and the reference images 422.

The first and second measurement images are then normalised 710. As mentioned above, the processing unit, COMP IM, 136 may be configured to process the first and second measurement images captured by the detection optical sensor 304 based on first and second reference images captured by the reference optical sensor 350. The processing unit, COMP IM, 136 may comprise a normalisation unit configured to normalise the first and second images accordingly.

In some arrangements, advantages may be provided by using optics that allow the use of broadband light (e.g. 300 nm-2000 nm), which lowers the costs of the metrology tools, allows a high throughput (which means that they have a high photon transmission efficiency) and/or allows a measurement of locations on the wafer with e.g. multiple wavelengths (in parallel or very fast in a serial manner).

In some arrangements there may be a desire to increase the rate at which metrology can be acquired to minimise the time spent on metrology. In order to achieve this disclosed herein is a metrology tool which can carry out metrology on multiple targets in parallel.

Figure 9A:
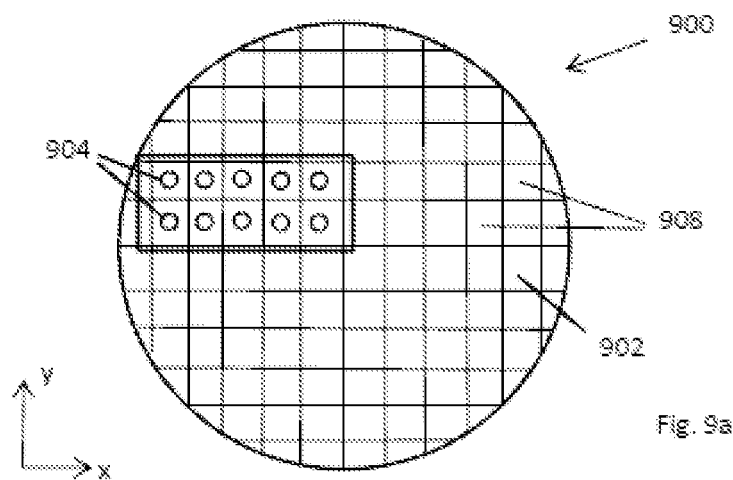
FIGS. 9a and 9b show schematic representations of a further exemplary metrology tool.
Figure 9B:
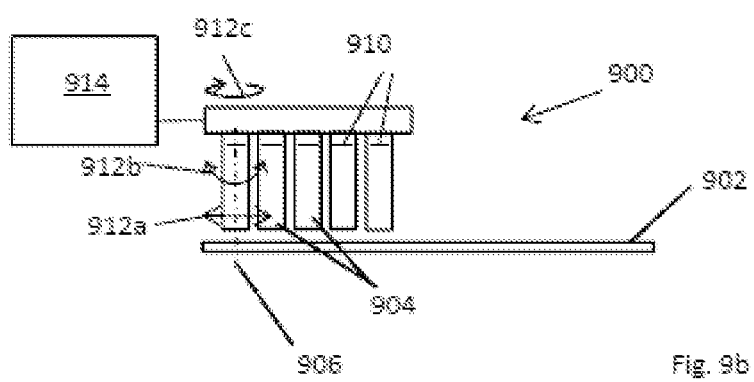

FIGS. 9a and 9b respectively show plan and side view schematic representations of metrology tool arrangement 900 comprising an array of detection optical systems. Each of the detection optical systems may comprise a detection optical sensor 910 and at least one lens for capturing a portion of illumination radiation scattered by the structure and transmitting the captured radiation towards the detection optical sensor 910, as described above in relation to FIGS. 4 and 6, for example. As such, the detection optical system may form part of a metrology tool for determining a parameter of interest of a structure fabricated on a substrate, the metrology tool additionally comprising: an illumination optical system for illuminating the structure with illumination radiation. Hence, each of array elements 904 shown in FIG. 9 may represent the system shown on the left hand side of FIG. 4, shown in FIG. 5a, shown in FIG. 5b and/or comprise a detection sensor without the illumination optical system. For the purposes of the following description, each of the optical detection systems will be referred to as elements of the array, or array elements 904.

Each of the array elements 904 includes an optical detector sensor 910 which may, for example, be similar to that shown and described in relation to FIG. 4, in relation to FIG. 5a, in relation to FIG. 5b and/or in relation to FIG. 6. The optical detector sensor has a sensor axis 906 which extends orthogonally between the detection optical sensor 910 and plane of the substrate 902.

The substrate 902 includes a plurality of dies 908, as indicated by the lines shown in FIG. 9a. Each of the array elements 904 may be positioned in relation to an individual die 908 and take metrology data therefrom. Hence, each of a plurality of dies 908 may include a single element array 904. The array elements 904 may be located in a common horizontal location with respect to each of the dies 908, such that metrology markers which are common to each of the dies and have corresponding positions in the dies can be measured in parallel by each of the sensors 910.

The array may comprise a tiled or tessellated arrangement of optical detection systems. Each optical detection system may be provided in a footprint area having a predetermined shape in which the footprint areas abut one another to provide the array. Each footprint area may be the same and may be polygonal, for example, each footprint area may be triangular, square or hexagonal. In one example, the array may be provided as a tessellation of hexagonal footprint areas to provide a honeycomb array. Thus, the array elements may be arranged in a honeycomb array. The array of optical detection systems is shown as a two dimensional array having m rows and n columns. The rows m may extend a first direction, for example, the x direction of the substrate and the columns may extend in a second direction, for example, the y direction. Either or both of the directions of the rows and columns may be inclined to the x or y direction. In general, the number of rows and columns will each be greater than 2. However, there can be as many rows or columns as desired for a particular field layout on a wafer or metrology footprint. The array may also be any desired shape and is not restricted to being a square or rectangular configuration. The number of array elements 904 can be varied to accommodate different applications. The size of the array may be, for example, up to 15 in the x direction and up to 100 in the y direction. In some examples, a single array element 904 may be provided for each of the respective dies 908 so as to cover the entire wafer. In other applications a discrete number of array elements 904 may be provided which is less than the number of dies 908. Each member of the array elements may be aligned with a different field of the substrate.

As indicated by the arrows 912a, 912b, 912c the array may be adjustable such that the array elements 904 (or parts thereof) is movable in relation to one another or the substrate 902. As shown, adjacent array elements 904 are separated from one another by a first distance. The first distance between adjacent array elements may correspond to the pitch of the dies or metrology targets. The first distance may be the same for all of the respective adjacent pairs of the array elements 904. As shown by arrow 912a, each of the array elements 904 may be moved such that the separation between the adjacent array elements may be altered from the first distance to the second distance. The movement of the array elements 904 may be done in the x and/or y direction.

The spacing may be a fixed pitch in accordance with the pitch of the dies 908 or metrology targets which are distributed across the substrate 902. As such, the spacing of the array elements 904 may be standard and one of a number of predetermined discrete spacing setting which correspond to standard features, such as the pitch of the die. The pitches may be, for example, 26 mm in the x direction and 33 mm in the y direction to correspond to conventional die sizes. Other pitches may include 26 mm by 16.5 mm. The metrology tool 900 may incorporate or have access to a list or library of one or more spacings which are conventional or frequently used. The predetermined spacings may form part of a fabrication recipe or be included as part of a set-up process for a particular process.

In order to obtain good metrology data, it is preferable that the sensor axis 906 be aligned so as to be perpendicular to the plane of the substrate 902 surface. A substrate surface of a processed wafer 902 can show local tilt variations of the order of several 100 microradians. In order to deal with these local tilt variations the array elements may be tiltable 912b so as to alter the angle between the sensor axis 906 and the substrate 902 surface. The tilt may be restricted to two orthogonal directions, for example, x and y directions where tipping the sensor in the x direction would cause the sensor axis to move along the x direction, and tipping the sensor in the y direction would cause the sensor axis to move along the y direction. Combinations of the two tipping directions may allow for any substrate tilt to be accommodated. As the variations in surface level may be local, each of the array elements may be moved independent from the other array elements 904. Typically, when tilting around the x-axis, motion in y direction will occur (and the other way around)

In order to determine the tilt of the array element 904, a tilt sensor may be incorporated within each of the array elements. The tilt sensor may be an optical sensor as known in the art, and may advantageously be incorporated into the optical sensor 910. Thus, each of the array elements 904 may comprise a combined overlay and tilt sensor.

When the metrology tool is being used to obtain overlay metrology data, it is advantageous to be able to correct for measurement errors which result from sensor asymmetry. This error may be referred to as Tool-Induced-Shift, TIS. To address TIS (or other similar issues), the array elements 904 may each be rotatable about the sensing axis 906. As such, each of the array elements 904 may be rotated from a first rotational position to a second rotational position in which the first and second positions are antiparallel to the extent they need to be to account for tool induced shift. Thus, the sensors may be rotated through approximately 180 degrees. The rotation will typically be around the insertion axis 906, however, a positional difference between the first and second rotational positions with respect to the surface of the substrate can be accounted for when processing the acquired metrology data. That is, a shift in the x-y position of the sensing axis 906 which occurs as a result of the rotation may be accommodated by modifying the overlay data with alignment data taken from the respective first and second rotational positions.

The movement of the array elements 904 may be achieved using suitable actuators known in the art. The actuators may be, for example, piezo motors. Thus, each of the array elements 904 may include one more actuators for each of the described ranges of motion.

The metrology tool may incorporate a positional controller 914 to which is configured to control the movement of the array elements 904. As such the positional controller 914 will be in communication with each of the actuators so as to provide the necessary control signals. The positional controller 914 may also be arranged to receive positional data either from the actuators, array elements 904 or some other source which can provide an indication of position of the array elements relative to the substrate 902. The positional controller 914 may be distributed among the element arrays or be provided as a central unit which is arranged to control all of the array elements individually. The central unit may be local to the metrology tool 900 or located remotely. The positional controller 914 may form part of a larger control system such as the computer system CL described above.

In use, the positional controller 914 will receive or determine a desired spacing between the adjacent array elements before moving each of the array elements 904 into the correct position.

Once the array elements 904 have been positioned, the position verified and any adjustments made, metrology data can the obtained as described above.

The array elements 904 may be separately controllable. The array elements 904 may have one or more of the above described ranges of movement. Hence, there may be examples in which the array elements 904 are arranged to tilt but not move in the x-y directions. This may be useful where the spacing of the array elements can be fixed in the x-y directions.

The array element 904 may be similar or equal array elements 904. For example, all array elements may be configured to operate in the same operational wavelength range. Even if the array element 904 are similar or equal, this does not exclude that each array element may receive illumination radiation of another wavelength in the full operational wavelength range of the array element, e.g. different array elements receive light at different wavelengths in the operational wavelength range of 200 to 2000 nm However, it is not necessary that all array elements 904 are similar or equal to each other. There may be at least one array element 904 that is different from the other array elements 904. The array element 904 may also be subdivided in groups of array elements 904 and within each group of array elements 904 the array element are similar or equal, but they may differ over the groups of array elements 904. For example, a first row or column of the array comprises a first type of array element, the second row or column of the array comprises a second type of array elements, etc. It is to be noted that one array element comprises a combination of an illumination optical system and a detection optical system. If array elements are different, their respective illumination optical systems and/or their respective detection optical systems may differ from each other.

A difference between the different types of array elements may be the operational wavelengths range of the array elements differ. E.g. a first type of array elements may be configured to operate in the wavelength range of visible light, e.g. 400-700 nm. E.g. a second type of array elements may be configured to operate in e.g. the infrared wavelength range, e.g. 700 nm-200 nm. E.g. a third type of array elements may be configured to operate in e.g. the Ultra Violet wavelength range, e.g. 200-400 nm. Each array element may be designed such that it operates optimally for its respective wavelength range. Illumination and/or detection optics may be optimized for the respective wavelength range, the detector/sensor/pixel array may be optimized for the respective wavelength range, etc.

In line with previously discussed embodiments, each individual array element 904 may have certain actuators for a fine positioning of the array element 904 in the array such that an advantageous positioning with respect to metrology structures on the substrate is provided.

The array of array elements 904 may be provided in the metrology tool at a fixed position, while the metrology tool is configured to move the substrate 902 with, for example, a moveable substrate table. The array of array elements 904 may also be moveable in the metrology tool. For example, the array of array elements 904 may be moveable such that one group of array elements 904 is positioned at a location that is e.g. a central position of the substrate table with the substrate 902. Thereby the centrally located group of array elements 904 can be used for measurements over the whole substrate 902 based on movements of the substrate 902 with respect to the array of array elements 904.

In the example described above in relation to FIG. 6, the AOTFs may be used as fast shutters to provide an improved acquisition time. In addition to this, or alternatively, a plurality of AOTFs may be used to provide a wavelength selection at multiple wavelengths such that multiple wavelengths can be detected by different detection optical sensors. The detection by the different detection optical sensors may be carried out at the same time. Providing multiple detection optical sensors detecting different colours can reduce acquisition time and increase throughput. Further, using multiple wavelengths can provide more information about the targets which may have different levels of sensitivity to the different wavelengths in different circumstances, as known in the art.

As described above, a radiation source may be a broadband light source and may be capable of generating radiation in a relatively wide wavelength range, for example, from 200 nm to 2000 nm. In some of the above described examples, the sensors may be configured to only detect a single wavelength at a time with the wavelength being selected by the acousto-optic-tunable filters described above in relation to FIG. 6, or otherwise. However, this may mean that only a very small fraction of the generated light radiated by a source is used at any one time. In some examples it may be beneficial to use the different wavelengths of the radiation source in parallel rather than selecting a single wavelength at a time. By using the wavelengths in parallel, the usable source power may be effectively increased. This can result in a reduction in the requirements of the radiation source, which are typically costly, or can allow the throughput to be increased.

Figure 10:
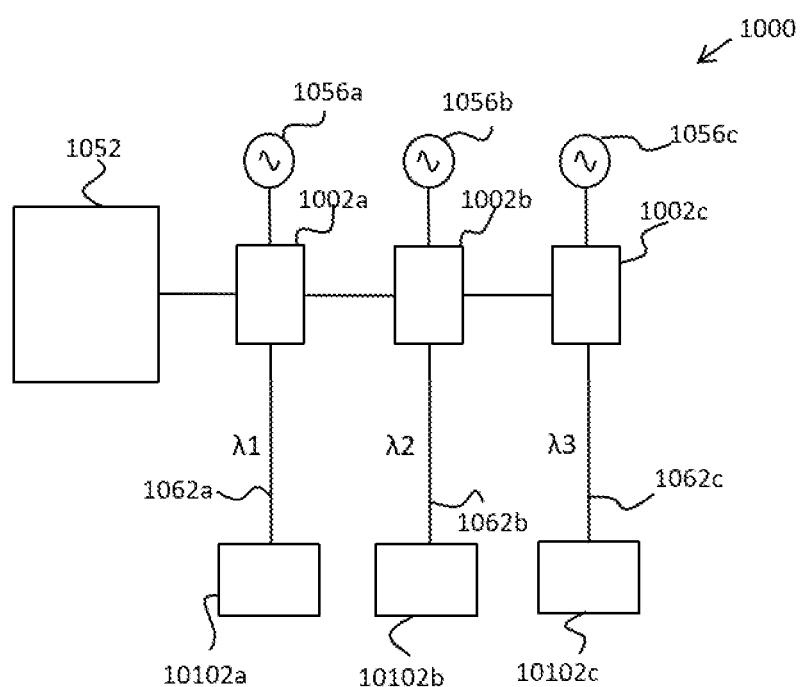
FIG. 10 shows a schematic representation of a further exemplary metrology tool.

FIG. 10 shows a schematic representation of a metrology tool 1000 for determining a parameter of interest of a structure fabricated on a substrate. FIG. 10 merely provides a schematic representation of a further inventive concept and aspects of the metrology tool will be similar to those known in the art or described above and may not be described in detail further here.

The metrology tool 1000 may comprise: an illumination optical system for illuminating the structure with illumination radiation. The illumination optical system may comprise: a broadband radiation source 1052 and a plurality of filters 1002a-c for filtering the broadband radiation emitted from the broadband radiation source 1052. Each filter 10002a-c may be configured to provide a filtered output comprising one or more wavelengths, typically a single wavelength, of illumination radiation for illuminating the structure. The illumination system may also include a plurality of optical paths 1062a-c for transmitting a respective one of the filtered outputs to the structure.

The metrology tool 1000 may also include a detection optical system comprising a plurality of detection optical sensors 10102a-c. The plurality of detection optical sensors 10102a-c may be arranged to detect illumination radiation scattered by the structure (not shown) provided by an associated one of the plurality of filters 1002a-c. Hence, a first filter 1002a may be configured to select one or more wavelengths which are delivered to the structure and the scattered light detected by a first one of the detection optical sensors 10102a. A second filter 1002b may have a similar relationship with a second sensor 10102b for a second wavelength and so on.

The radiation source 1052 may be a broadband radiation source as described previously in relation to FIGS. 4 and 6, for example, and may comprise a coherent radiation source emitting illumination radiation that is received by the first or each of the plurality of filters 1002a-c. The coherent radiation source comprises a laser emitting white light.

The filters may be ATOFs as are well known in the art, however, other filters may be used. Other filters may include one or more of: a filter wheel, a gradient filter or a prism to select the different colours. The filters 1002a-c, particularly AOTF filters, may be arranged in series or sequential relation such that unfiltered radiation passing through a first filter 1002a enters the next filter in line, e.g. 1002b. Thus, each of the AOTFs may be configured to filter out a single wavelength (or narrow range of wavelengths) and pass the remaining light to the next AOTF in the series.

The filtered wavelength is used to illuminate the target via an optical delivery path 1062a which may include one or more optical fibres, as shown. The optical delivery path may be coupled directly to the filters or may include one or more one or more re-directing element, such as a mirco-mirror, to selectively redirect the filtered light to the target via the transmission medium such as a fibre optic. In the example shown in FIG. 10, there are three filters arranged in series, however, it will be appreciated that other arrangements may be possible. Other arrangements may include more or less filters, however, there will typically be at least two filters to allow the selection of different wavelengths. In some embodiments, the AOTFs may be arranged in parallel. In such a case, the broadband radiation may be split by one or more beam splitters and sent down parallel paths, with each parallel path comprising a separate filter. Each filter may filter a different frequency. However, it will be appreciated that this may lead to a lower efficiency.

An optical sensor similar to that shown and described either of FIG. 4 or 6 may be used in the arrangement. Thus, the sensor may be a single sensor and may be capable of detecting the radiation of different wavelengths. In other embodiments, the sensors may include multiple detectors, e.g. camera chips, which are capable of each measuring specific ranges of wavelengths. In this case, the optical system may split the illumination radiated from the target to provide a beam for each detector.

In some examples, it may be advantageous to use multiple optical detection systems similar to those disclosed in FIGS. 9a and 9b to allow for parallel metrology and an associated increased throughput. Thus, each sensor shown in FIG. 10 may form one of a plurality of sensors which are each arranged to detect the illumination radiation scattered from a plurality of separate areas on the substrate, as previously described. Thus, each sensor 10102a-c may be aligned with an individual die, for example.

Each of the filters 10102a-c may provide radiation of a predetermined wavelength to a single structure. Thus, the first filter may provide illumination having a first wavelength to a first structure, and a second filter may provide illumination having a second wavelength to a second structure. The first and second structures may be provided on respective dies.

In some examples, the filters 10102a-c may be adjusted to cycle through the different wavelengths such that each of the respective targets is illuminated by the different wavelengths in turn. Thus, after a predetermined acquisition time, the first filter 1002a may be adjusted to provide a second wavelength $\lambda 2$ to the first structure, and the second filter 1002b may be adjusted to provide the first $\lambda 1$ (or a third $\lambda 3$ or further) wavelength to the second structure, and so on. In this way, the different structures are exposed to each of the wavelengths in turn and the scattered light may be detected by the sensors to provide a range of wavelength specific data. Thus, in some examples, the AOTFs may be configured to cycle through a plurality of predetermined wavelengths such that the wavelengths detected by the sensor or groups of sensors can receive all of the desired wavelengths in a time separated manner. In the example of FIG. 10, there are three sensors 10102a-c, each of which may be used to provide wavelengths $\lambda 1$, $\lambda 2$ and $\lambda 3$ in turn. It will be appreciated that there may be any number of different wavelengths from 2 to N, as required. The adjustment of the filters may be achieved with the signal generators 1056a-c as described above and known in the art.

In relation to FIGS. 9a and 9b, the filters 1002a-c and sensors 10102a-c may be provided in any arrangement within the array. Hence, the array may comprise groups of sensors each measuring the same or different wavelengths at any given time. Thus, the sensors shown in FIG. 10 may comprise a plurality of sensors in which each of the sensors in the plurality of sensors are provided at a different location in respect of the wafer. There may be a first plurality of sensors measuring $\lambda 1$, a second plurality measuring $\lambda 2$, and a third plurality measuring $\lambda 3$, for example.

The radiation source may be polarised or unpolarised, as described above. In the case of an unpolarised light source, both linear polarisations may be used simultaneously if they are distributed over time in a similar fashion to the selection of the AOTF wavelengths described above.

It is envisaged that providing the arrangement of FIG. 10 or its variants described above, and/or an array of array elements 904 may be done in conjunction with any of the features described in connection with the above described examples and embodiments, where possible. It is also envisaged that the array of array elements may be implemented in some systems which do not include all of the features of some of the described examples. Thus, for example, a metrology tool having an illumination optical system for illuminating the structure with illumination radiation may or may not share an optical element with any of the detection optical systems where there is an array of detection optical elements and/or illumination optical systems.

Further embodiments are provided in the subsequent numbered clauses:

1. A metrology tool for determining a parameter of interest of a structure fabricated on a substrate, the metrology tool comprising:
   an illumination optical system for illuminating the structure with illumination radiation under a non-zero angle of incidence;
   a detection optical system comprising a detection optical sensor and at least one lens for capturing a portion of illumination radiation scattered by the structure and transmitting the captured radiation towards the detection optical sensor,
   wherein the illumination optical system and the detection optical system do not share an optical element.

2. The metrology tool according to clause 1, wherein at least part of an optical axis of the illumination optical system is substantially parallel to an optical axis of the detection optical system.

3. The metrology tool according to clause 1 or 2, wherein at least part of the illumination optical system is positioned radially outwards from a radial extent of the detection optical system.

4. The metrology tool according to any preceding clause, wherein the illumination optical system comprises a plurality of discrete optical paths.

5. The optical system according to clause 4, wherein at least two of the plurality of optical paths are diametrically opposed.

6. The metrology tool according to any preceding clause, wherein the illumination optical system comprises at least one mirror for reflecting illumination radiation towards the structure.

7. The metrology tool according to clause 6 when dependent on directly or indirectly on clause 4 or 5, comprising at least one mirror in one or more of the plurality of optical paths.

8. The metrology tool according to clause 6 or 7, wherein the at least one mirror is configured to direct the illumination radiation onto the structure through a volume between at least one lens of the detection optical system and the substrate.

9. The metrology tool according to any of clauses 6 to 8, wherein the at least one mirror is configured to direct radiation having a plurality of wavelengths in a range from 200 nm to 2 µm to substantially the same point on the substrate.

10. The metrology tool according to any of clauses 6 to 9, wherein the at least one mirror is one of an elliptical or a parabolic mirror.

11. The metrology tool according to any of clauses 6 to 10 wherein the at least one mirror has a reflectivity greater than 90% across a range of wavelengths of the illumination radiation.

12. The metrology tool according to any preceding clause, wherein the detection optical system has a total transmissivity of greater than 90%.

13. The metrology tool according to any preceding clause, wherein the detection optical system comprises 5 optical elements or fewer.

14. The metrology tool according to any preceding clause, wherein the detection optical system comprises one or more of: a plano-convex lens; an aspheric lens; a bisphericcal lens; a bi-aspheric lens and a long working distance objective.

15. The metrology tool according to any preceding clause, wherein the detection optical system comprises a plurality of lenses, and wherein one of the plurality of lenses positioned closest to the substrate has a working distance between the substrate and a surface of the lens of one of: greater than 300 µm; greater than 500 µm; in a range from 300 µm to 1 mm; and in a range from 300 µm to 10 mm.

16. The metrology tool according to clause 15, wherein the lens has a numerical aperture of: greater than 0.4; greater than 0.7; greater than 0.9; or 0.95 or greater.

17. The metrology tool according to any preceding clause, further comprising a focus system comprising at least one focussing optical sensor configured to receive zeroth order radiation reflected from the structure and a computational imaging processor configured to determine a focus of the detection optical system based on.

18. The metrology tool according to clause 17, wherein the focussing optical sensor comprises a quad optical sensor, arranged such that a proportion of the reflected zeroth order radiation that is sensed by each optical sensor in the quad optical sensor is indicative of a position of the structure.

19. The metrology tool according to clause 17 or 18 when dependent directly or indirectly on clause 4 wherein at least one of the plurality of discrete optical paths is configured to receive, at least in part, reflected zeroth order radiation originating from at least one other of the optical paths, and wherein the at least one of the plurality of discrete optical paths comprises a reflective optical element configured to direct the received zeroth order radiation towards the at least one focussing optical sensor.

20. The metrology tool according to clause 19, wherein the at least one focussing optical sensor is positioned radially outwards from a radial extent of the detection optical system.

21. The metrology tool according to any preceding clause, further comprising a polarization element arranged around an outer of the detection optical system and configured to interact with radiation propagating through the illumination optical system for polarization thereof.

22. The metrology tool according to clause 21, wherein the polarization element is configurable to apply one of s or p polarization at a plurality of magnitudes.

23. The metrology tool according to clause 22, wherein the polarization element is rotatable to apply one of s or p polarization at one of a plurality of magnitudes.

24. The metrology tool according to clause 22 or 23 when dependent directly or indirectly on clause 4, and configured to apply one of s or p polarization at one of a plurality of magnitudes to one or more of the plurality of optical paths.

25. The metrology tool according to any preceding clause, wherein the detection optical sensor is configured to acquire a first image based on reflected and/or diffracted radiation having one order, and further configured to acquire a second image based on reflected and/or diffracted radiation having a further order.

26. The metrology tool according to any preceding clause when dependent directly or indirectly on clause 4, comprising a shutter system positioned in at least one of the plurality of optical paths configurable between an open position in which illumination radiation is allowed to pass and a closed position in which illumination radiation is blocked.

27. The metrology tool according to clause 26, wherein the shutter system comprises one or more acousto-optic-tunable filters.

28. The metrology tool according to clause 26 or 27, further comprising a reference optical sensor, wherein the at least one of the plurality of optical paths comprises a beam splitter configured to direct a proportion of the illumination radiation to the reference optical sensor when the shutter system is in the open position.

29. The metrology tool according to clause 28, wherein the proportion of the illumination radiation is less than 5%.

30. The metrology tool according to clause 28 or 29, further comprising an image normalisation unit configured to normalise the first and second images based on a reference image acquired by the reference optical sensor.

31. The metrology tool according to any of clauses 28 to 30, further comprising an acquisition controller configured to control the reference optical sensor, the detection optical sensor and the shutter system for capturing the first and second images.

32. The metrology tool according to clause 31, wherein a first shutter system is positioned in a first optical path of the illumination optical system and a second shutter system is positioned in a second optical path of the illumination optical system, and wherein the first shutter system is operable for acquiring the first image and the second shutter system is operable for acquiring the second image.

33. The metrology tool according to clause 32, wherein the acquisition controller is configured to place the reference optical sensor in an acquisition phase and to open and close the first and second shutter systems sequentially while the reference optical sensor is in the acquisition phase.

34. The metrology tool according to clause 33, wherein the acquisition controller is further configured to place the detection optical sensor in a first acquisition phase such that the first shutter system is opened and closed while the detection optical sensor is in the first acquisition phase for acquiring the first image, and wherein the acquisition controller is further configured to place the detection optical sensor in a second acquisition phase such that the second shutter system is opened and closed while the detection optical sensor is in the second acquisition phase for acquiring the second image 35. The metrology tool of any preceding clause, wherein the illumination optical system and the detection optical system has a footprint less than the area of a field of the substrate.

36. The metrology tool according to any preceding clause, wherein the combination of the illumination optical system and the detection optical system has at least one of an x-dimension and a y-dimension less than 26 mm.

37. The metrology tool according to any preceding clause comprising a plurality of illumination optical system and detection optical system combinations in an array, wherein each of the plurality of illumination optical system and detection optical system combinations comprises an array element, each array element having a sensing axis.

38. The metrology tool according to clause 37, wherein each array element is aligned with a different field of the substrate.

39. The metrology tool according to either of clauses 37 or 38, wherein the array elements are arranged in a two dimensional array.

40. The metrology tool according to clause 39, wherein each array element has an array element footprint area on the substrate and the array comprises a tessellation of footprint areas.

41. The metrology tool according to clause 40, wherein the footprint areas within the array are the same and one of triangular, square, rectangular or hexagonal in shape.

42. The metrology tool according to clause 41, wherein the footprint areas are arranged in a honeycomb.

43. The metrology tool according to any of clauses 39 to 42, wherein the two dimensional comprises m rows and n columns, wherein m and n are both greater than 2.

44. The metrology tool according to any of clauses 37 to 43, wherein the array is adjustable such that the separation between adjacent array elements can be altered in at least one of the x direction or y direction.

45. The metrology tool according to any of clauses 37 to 44, wherein the elements of the array sensors are tiltable with respect to the plane of the substrate, such that the sensing axis of each array element is adjustable so as to be perpendicular with a substrate.

46. The metrology tool according to clause 45, wherein each array element comprises a tilt sensor.

47. The metrology tool according to clause 46, wherein the tilt sensor is located within the detection optical system.

48. The metrology tool according to clause 47, wherein the tilt sensor is an optical sensor.

49. The metrology tool according to clause 47 or 48, wherein the sensing element is located within the detection optical sensor.

50. The metrology tool according to any of clauses 37 to 49, wherein each array element is rotatable about the sensing axis.

51. The metrology tool according to clause 50, wherein the element is configured to be rotatable about the sensing axis from a first position to a second position, wherein the first and second positions are in anti-parallel.

52. The metrology tool according to any of clauses 37 to 51, wherein each array element comprises one or more actuators configured to move the array elements.

53. The metrology tool according to clause 52, wherein the actuators comprise piezo motors.

54. The metrology tool according to any of clauses 37 to 53, further comprising a controller, wherein the controller is configured to position the array elements at a predetermined pitch, wherein the predetermined pitch corresponds to the pitch of metrology targets on a substrate.

55. The metrology tool according to any of clauses 37 to 54, wherein the spacing of the array elements corresponds to a die pitch of a substrate.

56. The metrology tool according to any of clauses 37 to 55, wherein the pitch of the array elements in the x or y direction is one or more of 16.5 mm, 26 mm, 33 mm.

57. The metrology tool according to any of clauses 4 to 54, comprising a coherent radiation source emitting illumination radiation that is received by a plurality of optical paths of the illumination optical system.

58. The metrology tool according to clause 55, wherein the coherent radiation source comprises a laser emitting white light.

59. A metrology tool for determining a parameter of interest of a structure fabricated on a substrate, the metrology tool comprising:
an illumination optical system for illuminating the structure with illumination radiation;
an array of detection optical systems comprising a detection optical sensor and at least one lens for capturing a portion of illumination radiation scattered by the structure and transmitting the captured radiation towards the detection optical sensor,
wherein each element of the array of detection optical systems is adjustable such that the separation between adjacent elements of the array can be altered in at least one of the x direction or y direction.

60. A metrology tool for determining a parameter of interest of a structure fabricated on a substrate, the metrology tool comprising:
an illumination optical system for illuminating the structure with illumination radiation;
an array of detection optical systems comprising a detection optical sensor and at least one lens for capturing a portion of illumination radiation scattered by the structure and transmitting the captured radiation towards the detection optical sensor,
wherein the array is a two dimensional array with array elements arranged in a two dimensional array having m rows and n columns.

60a. A metrology tool according to any one of the clauses 37 to 55 wherein the illumination optical system and detection optical system combinations forming the array elements comprise at least one illumination optical system and detection optical system combination that is different from another illumination optical system and detection optical system combination.

60b. A metrology tool according to clause 60a, wherein the at least one illumination optical system and detection optical system combination that differs from the another illumination optical system and detection optical system combination comprises an illumination optical system and/or detection optical system that are configured to operate in a first operational wavelength range that is different from an second operational wavelength range of the another illumination optical system and detection optical system combination.

60c. A metrology tool according to any one of the clauses 60a and 60b, wherein groups of illumination optical system and detection optical system combinations are provided and within a single one of the groups the illumination optical system and detection optical system combinations are equal to each other, while the different groups have different illumination optical system and detection optical system combinations.

61. A metrology tool for determining a parameter of interest of one or more structures fabricated on a substrate, the metrology tool comprising:
an illumination optical system for illuminating the one or more structures with illumination radiation, wherein the illumination optical system comprises a broadband radiation source, a plurality of filters for filtering the broadband radiation emitted from the broadband radiation source, wherein each of the plurality of filters is configured to provide a filtered output comprising one or more wavelengths of illumination radiation for illuminating one or more of the structures, and, a plurality of optical paths for transmitting a respective one of the filtered outputs to the one or more structures;
a detection optical system comprising a plurality of detection optical sensors, wherein each of the plurality of detection optical sensors is arranged to detect illumination radiation scattered by the structure provided by an associated one of the plurality of filters.

62. A metrology tool according to clause 61, wherein the plurality of filters are arranged in series, wherein each filter removes the one or more wavelengths of illumination radiation and transmits the remaining wavelengths to the next filter in the series.

63. A metrology tool according to clause 62, wherein the filters are tuneable such that one or more wavelengths (or ranges of wavelengths) may be selected from the broadband illumination radiation.

64. A metrology tool according to clauses 63, further comprising a controller configured to control the selection of the one or more wavelengths for each one of the plurality of filters.

65. A metrology tool according to clause 64, wherein the controller is configured to periodically change the selection of the one or more wavelengths so as to cycle through a plurality of different one or more wavelengths such that each of the plurality of optical detection sensors receives scattered light from each of the one or more wavelengths.

66. A metrology tool according to any of clauses 61 to 65, wherein the plurality of optical paths each comprise an optical fibre for transmitting the one or more wavelengths of radiation from the respective each of the plurality of filters to the target.

67. A metrology tool according to any of clauses 61 to 66, wherein each of the plurality of filters is an ATOF.

68. A metrology tool according to any of clauses 61 to 67 further comprising an array of detection optical systems each comprising a plurality of detection optical sensors and at least one lens for capturing a portion of illumination radiation scattered by the structure and transmitting the captured radiation towards the plurality of detection optical sensors.

69. A metrology tool comprising:
a broadband illumination source;
a plurality of ATOFs arranged in series and configured to select one or more wavelengths for transmission to a target structure;
a plurality of detection optical sensors, each detection optical sensor configured to detect radiation from one of the ATOFs.

70. A metrology tool according to clause 69, wherein the plurality of ATOFs are cycled to select different one or more wavelengths such that each of the detection optical sensors receives illumination of different wavelengths over time.

71. A metrology tool according to clause 69, wherein further comprising groups of detection optical sensors in which each of the detection optical sensors within a group is configured to detect the same wavelength as the other detectors in the group of detection optical sensors.

72. A metrology tool according to any of clauses 61 to 71, wherein each of the plurality of sensors is aligned with an individual target and/or die of the substrate.

73. A metrology tool according to clause 68, further comprising any of the features provided in any of clauses 37 to 58 with or without the clauses from which they depend.

It will be appreciated that clauses 59 and 60 above, may be combined with any of clauses 1 to 58, in particular, the features recited in clauses 37 to 58 may be made to depend on clauses 59 and/or 60 as appropriate. It will also be appreciated that any of clauses 61 to 67 may be combined with any of clauses 1 to 60.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

The skilled person will be able to envisage other embodiments without departing from the scope of the appended claims.

The invention claimed is:

1. A metrology system for analyzing a substrate comprising a plurality of targets and a plurality of fields, the metrology system comprising:
an array comprising a plurality of array elements, wherein each array element of the plurality of array elements is configured to be aligned with a corresponding field of the plurality of fields, and wherein each array element comprises:
an illumination optical system configured to illuminate a corresponding target of the plurality of targets, wherein the corresponding target is disposed at the corresponding field; and
a detection optical system comprising:
a lens configured to direct a portion of illumination scattered from the corresponding target; and
a detection optical sensor configured to receive the directed portion of illumination scattered from the corresponding target and to generate information associated with the illumination scattered from the corresponding target,
wherein the illumination optical system and the detection optical system together have a footprint less than an area of the corresponding field of the substrate.

2. The metrology system of claim 1, wherein at least part of an optical axis of the illumination optical system is substantially parallel to an optical axis of the detection optical system.

3. The metrology system of claim 1, wherein the plurality of array elements are arranged in a two dimensional array.

4. The metrology system of claim 3, wherein each array element of the plurality of array elements has a footprint area, defined parallel to a plane of the substrate, and the two dimensional array comprises a tessellation of the footprint area.

5. The metrology system of claim 4, wherein the footprint area comprises a triangular, square, rectangular, or hexagonal shape.

6. The metrology system of claim 5, wherein the tessellation comprises a honeycomb arrangement using the footprint area.

7. The metrology system of claim 1, wherein the array elements are further configured to move in a first direction parallel to a plane of the substrate.

8. The metrology system of claim 7, wherein the array elements are further configured to move in a second direction parallel to the plane of the substrate that is different from the first direction.

9. The metrology system of claim 8, wherein the array elements are further configured to tilt with respect to the plane of the substrate such that a sensing axis of each array element is adjustable based on the tilting.

10. The metrology system of claim 9, wherein the array elements further comprise tilt sensors.

11. The metrology system of claim 1, wherein the array elements are further configured to rotate about an optical axis.

12. The metrology system of claim 1, wherein the array elements further comprise actuators configured to move the array elements.

13. The metrology system of claim 12, wherein the actuators comprise piezo motors.

14. The metrology system of claim 1, further comprising a positional controller configured to adjust a pitch of the plurality of array elements.

15. The metrology system of claim 14, wherein the adjusting of the pitch is performed to match a pitch of the plurality of targets.

16. The metrology system of claim 15, wherein the pitch of the plurality of targets corresponds to a pitch of dies of the substrate.

17. The metrology system of claim 1, further comprising an illumination source configured to generate illumination, wherein the illumination optical system of each array element of the plurality of array elements is further configured to direct a portion of the generated illumination toward the corresponding target.

18. The metrology system of claim 1, wherein the illumination optical system and the detection optical system do not share an optical element.

19. A metrology system comprising:
an array comprising a plurality of array elements, wherein each array element of the plurality of array elements is configured to be aligned with a corresponding field of a plurality of fields, and wherein each array element comprises:
  an illumination optical system configured to illuminate a corresponding target of a plurality of targets, wherein the corresponding target is disposed at the corresponding field; and
  a detection optical system comprising:
    at least one lens configured to direct a portion of illumination scattered from the corresponding target; and
    a detection optical sensor configured to receive the directed portion of illumination scattered from the corresponding target and to generate information associated with the illumination scattered from the corresponding target; and
a computational imaging processor configured to:
  communicate with the plurality of array elements;
  receive aberration information of the at least one lens and generated image information; and
  adjust the image information based on the aberration information.

* * * * *

UNITED STATES PATENT AND TRADEMARK OFFICE
CERTIFICATE OF CORRECTION

PATENT NO. : 11,940,739 B2
APPLICATION NO. : 17/562446
DATED : March 26, 2024
INVENTOR(S) : Pandey et al.

It is certified that error appears in the above-identified patent and that said Letters Patent is hereby corrected as shown below:

In the Specification

In Column 2, Line 4, delete "K1." and insert -- $K_1$. --, therefor.

In Column 7, Line 61, delete "operation" and insert -- operation; --, therefor.

In Column 7, Line 67, delete "tool." and insert -- tool; --, therefor.

In Column 8, Line 2, delete "tool." and insert -- tool; --, therefor.

In Column 12, Line 20, delete "124" and insert -- 126 --, therefor.

In Column 16, Line 64, delete "beamsplitter" and insert -- beam splitter --, therefor.

In Column 23, Line 13, delete "10102a-c" and insert -- 1002a-c --, therefor.

In Column 23, Line 20, delete "10102a-c" and insert -- 1002a-c --, therefor.

Signed and Sealed this
Seventh Day of May, 2024

Katherine Kelly Vidal
*Director of the United States Patent and Trademark Office*